US007093185B2

(12) United States Patent
Kim et al.

(10) Patent No.: US 7,093,185 B2
(45) Date of Patent: Aug. 15, 2006

(54) APPARATUS AND METHOD FOR GENERATING CODES IN COMMUNICATION SYSTEM

(75) Inventors: Min-Goo Kim, Suwon-shi (KR); Jae-Sung Jang, Kwachon-shi (KR)

(73) Assignee: Samsung Electronics Co., Ltd., (KR)

( * ) Notice: Subject to any disclaimer, the term of this patent is extended or adjusted under 35 U.S.C. 154(b) by 383 days.

(21) Appl. No.: 10/074,422

(22) Filed: Feb. 12, 2002

(65) Prior Publication Data

US 2002/0129314 A1 Sep. 12, 2002

(30) Foreign Application Priority Data

Feb. 13, 2001 (KR) ................. 2001-8275
Feb. 14, 2001 (KR) ................. 2001-7357

(51) Int. Cl.
*H03M 13/03* (2006.01)
(52) U.S. Cl. .............. 714/790; 714/774; 714/822
(58) Field of Classification Search ........... 714/774, 714/790, 822
See application file for complete search history.

(56) References Cited

U.S. PATENT DOCUMENTS

| 5,357,249 | A | * | 10/1994 | Azaren et al. ............ 341/100 |
| 5,907,582 | A |   | 5/1999  | Yi |
| 6,298,463 | B1 |  | 10/2001 | Bingeman et al. |
| 6,744,744 | B1 | * | 6/2004 | Tong et al. ................ 370/320 |
| 6,877,130 | B1 |  | 4/2005  | Kim et al. |

FOREIGN PATENT DOCUMENTS

| EP | 1 172 959 | 1/2002 |
| EP | 1 172 959 A2 | 1/2002 |
| EP | 1 231 737 A1 | 8/2002 |
| WO | WO 02/33876 A1 | 4/2002 |
| WO | WO 02/33910 A1 | 4/2002 |

OTHER PUBLICATIONS

U.K. Combined Search and Examination Report dated Oct. 8, 2002 issued in a counterpart application, namely, Appln. No. GB 0203400.7.
European Search Report dated Feb. 24, 2003, issued in a counterpart application, namely, Appln. No. 02003369.2.
Narayanan et al., "Physical Layer Design for Packet Data over IS-136", Vehicular Technology Conference, 1997, IEEE 47th Phoenix, AZ, USA May 4-7, 1997, pp. 1029-1033.
"OFDMA PHY Enhancements using Hybrid ARQ"; Mar. 15, 2004; 8 pgs.
Min-Goo Kim et al.; "Quasi-Complementary Turbo Codes (QCTC) for Applications in High-Data-Rate Systems"; 2003; pp. 2381-2385.

\* cited by examiner

*Primary Examiner*—Joseph Torres
(74) *Attorney, Agent, or Firm*—Dilworth & Barrese LLP

(57) ABSTRACT

A QCTC (Quasi-Complementary Turbo Code) generating apparatus having: a turbo encoder for generating an information symbol sequence and a plurality of parity symbol sequences by encoding the information symbol sequence; a channel interleaver for individually interleaving the symbol sequences, generating new parity symbol sequences by multiplexing the symbols of parity symbol sequences with the same priority levels, and serially concatenating the information symbol sequence and the new parity symbol sequences; and a QCTC generator for generating a sub-code with a given code rate by recursively selecting a predetermined number of symbols from the concatenated symbol sequence at a given starting position.

10 Claims, 3 Drawing Sheets

APPARATUS AND METHOD FOR GENERATING CODES IN COMMUNICATION SYSTEM

PRIORITY

This application claims priority to an application entitled "Apparatus and Method for Generating Codes in Communication System" filed in the Korean Industrial Property Office on Feb. 13, 2001 and assigned Ser. No. 2001-8275, and to an application entitled "Apparatus and Method for Generating Codes in Communication System" filed in the Korean Industrial Property Office on Feb. 14, 2001 and assigned Ser. No. 2001-7357, the contents of both of which are hereby incorporated by reference.

BACKGROUND OF THE INVENTION

1. Field of the Invention

The present invention relates generally to code generation in a data communications system, and in particular, to an apparatus and method for generating complementary turbo codes, considering the characteristics of turbo codes in a packet communications system or a general communications system that employs a retransmission scheme.

2. Description of the Related Art

In general, a system using a retransmission scheme (e.g., HARQ: Hybrid Automatic Repeat Request) performs soft combining to improve transmission throughput. The soft combining techniques are divided into packet diversity combining and packet code combining. These two combining schemes are usually called soft packet combining. Although the packet diversity combining scheme is suboptimal in performance relative to the packet code combining scheme, it is favorable due to easy implementation when performance loss is low.

A packet transmission system uses the packet code combining scheme to improve transmission throughput. A transmitter transmits a code with a different code rate at each packet transmission. If an error is detected from the received packet, a receiver requests a retransmission and performs soft combining between the original packet and a retransmitted packet. The retransmitted packet may have a different code from the previous packet. The packet code combining scheme is a process of combining received N packets with a code rate R to a code with an effective code rate of R/N prior to decoding, to thereby obtain a coding gain.

With regard to the packet diversity combining scheme, on the other hand, the transmitter transmits the same code with a code rate R at each packet transmission. If an error is detected from the received packet, the receiver requests a retransmission and performs soft combining between the original packet and the retransmitted packet. The retransmitted packet has an identical code to that in the previous packet. In this sense, the packet diversity combining scheme can be considered the received symbol energy averaging on a random channel. The packet diversity combining scheme reduces noise power by averaging the soft outputs of the received input symbols and achieves such a diversity gain as offered by a multi-path channel because the same code is repeatedly transmitted on a fading channel. However, the packet diversity combining scheme does not provide such an additional coding gain as obtained according to a code structure in the packet code combining scheme.

A turbo encoder for generating the turbo code will be described hereinbelow. In the case of a turbo encoder with R=⅕, the turbo encoder generates information symbols X, first parity symbols $Y_0$, $Y_0'$ and second parity symbols $Y_1$, $Y_1'$ by encoding input information symbols. The turbo encoder is comprised of two constituent encoders and one interleaver. The first parity symbols $Y_0$ and $Y_0'$ are output from a first constituent encoder by encoding the input information symbols and the second parity symbols $Y_1$ and $Y_1'$ from a second constituent encoder by encoding the information symbols interleaved through the interleaver. In detail, the $Y_0$ is a row of first parity symbols generated from a first constituent encoder, and the $Y_0'$ is a row of second parity symbols generated from the first constituent encoder.

Due to implementation simplicity, most packet communication systems have used the packet diversity combining scheme, which is under study for application to the synchronous IS-2000 system and the asynchronous UMTS system. The reason is that the existing packet communication systems have used convolutional codes and even packet code combining does not offer a great gain when convolutional codes with a low data rate are used. If a system with R=⅓ supports retransmission, there is not a wide difference in performance between the packet code combining scheme and the packet diversity combining scheme. Thus, the packet diversity combining scheme is selected considering implementation complexity. However, use of turbo codes as forward error correction codes (FEC) requires a different packet combining mechanism because the turbo codes are designed as error correction codes to have performance characteristics very close to the "Shannon Channel Capacity Limit" and their performance varies obviously with the coding rates unlike convolutional codes. Therefore, it can be concluded that packet code combining is desirable for a packet communication system using turbo codes in a retransmission scheme to achieve the goal of optimum performance.

SUMMARY OF THE INVENTION

It is, therefore, an object of the present invention to provide an apparatus and method for generating sub-codes that enable optimum code combining in a retransmission system using turbo codes.

It is another object of the present invention to provide an apparatus and method for generating complementary codes using turbo codes in a communication system.

It is a further object of the present invention to provide an apparatus and method for generating sub-codes to be generated after channel interleaving in a retransmission system using channel interleaving.

The foregoing and other objects of the present invention are achieved by providing a QCTC (Quasi-Complementary Turbo Code) generating apparatus. In the QCTC generating apparatus, a turbo encoder has a plurality of constituent encoders and at least one interleaver and generates an information symbol sequence and a plurality of parity symbol sequences according to a given code rate by encoding the information symbol sequence. The constituent encoders generate the plurality of parity symbol sequences, each of the constituent encoders generates at least one parity symbol sequence, and the at least one parity symbol sequence from one constituent encoder corresponds to the at least one parity symbol sequence from another constituent encoder. A channel interleaver individually interleaves the information symbol sequence and the parity symbol sequences, alternately arranges the symbols of the corresponding parity symbol sequences, and serially concatenates the interleaved information symbol sequence and the arranged parity symbol sequences. A QCTC generator generates a sub-code of a QCTC by repeating the serially concatenated symbol sequence and selecting a predetermined number of symbols from the repeated symbol sequence according to code rate and selection information.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described hereinbelow with reference to the accompanying drawings. In the following description, well-known functions or constructions are not described in detail since they would obscure the invention in unnecessary detail.

The present invention provides a QCTC generating method for a system using channel interleaving and a method of generating QCTCs in a predetermined way irrespective of a variable code length in a system requiring QCTCs with a variety of code rates. A QCTC is defined as a complementary code generated using a turbo code. The QCTC is not a perfect complementary code as noted from the term "quasi" because a sub-code includes repeated symbols and has a different characteristic such as error correcting capability from another sub-code.

Figure 1:
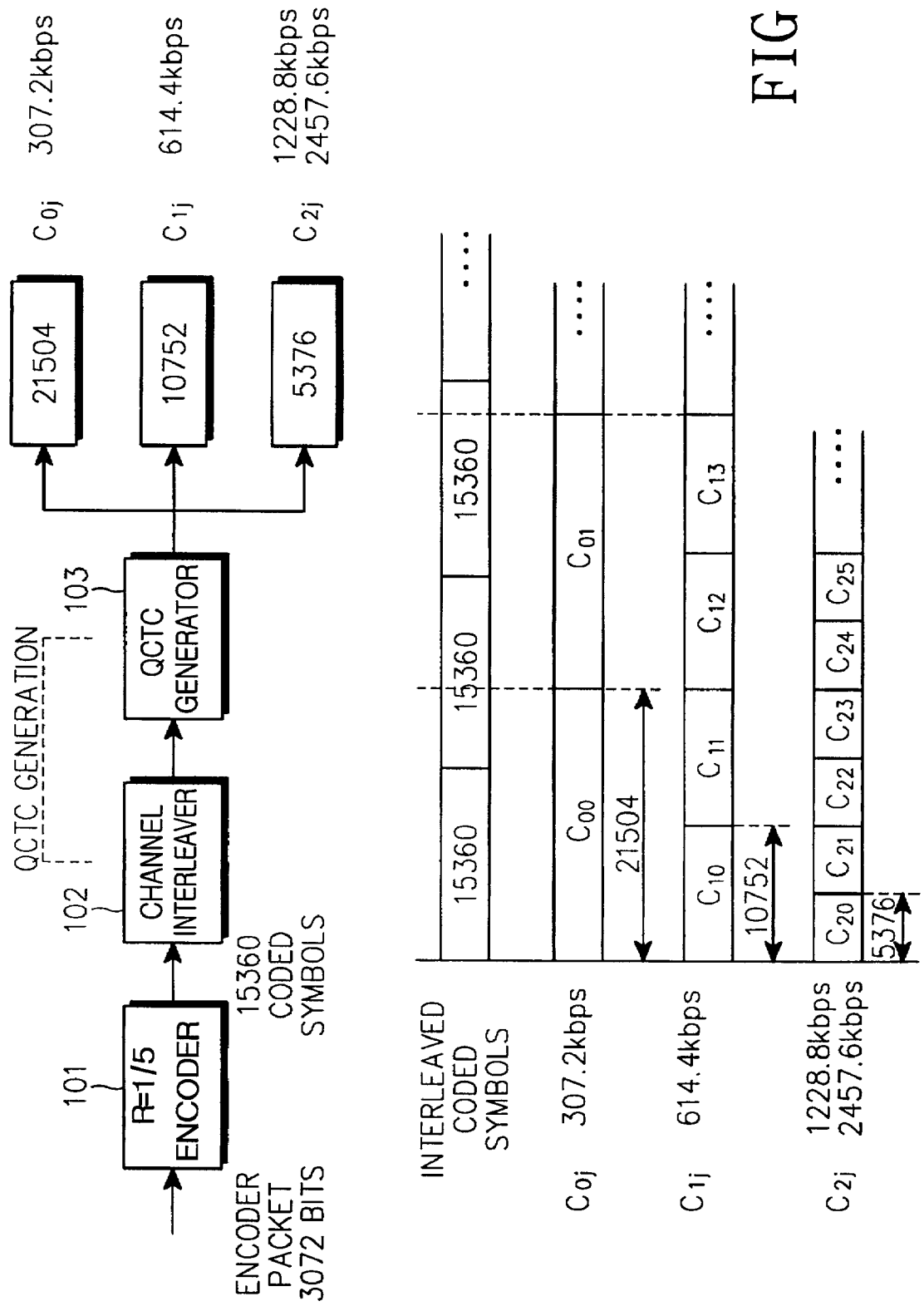
FIG. 1 is a schematic block diagram of a QCTC (Quasi-Complementary Turbo Code) generating apparatus according to the present invention.

FIG. 1 is a schematic block diagram of a QCTC generating apparatus according to the present invention. The QCTC generating apparatus shown in FIG. 1 is characterized by carrying out symbol sequence repetition and puncturing after channel interleaving when generating sub-codes.

Referring to FIG. 1, an encoder 101 generates code symbols by encoding an input encoder packet. A convolutional encoder or a turbo encoder can be used as the encoder 101. The encoder 101 has a code rate of, for example, ⅕. For the input of 3,072 information bits, the encoder 101 outputs 15,360 code symbols. A channel interleaver 102 interleaves the code symbols according to a predetermined rule. If the encoder 101 is a turbo encoder, the interleaver 102 interleaves information symbols X, and parity symbols $Y_0$, $Y_1$, $Y_0'$, and $Y_1'$ separately. A QCTC generator 103 generates sub-codes by puncturing and repeating the interleaved symbols. The channel interleaver 102 and the QCTC generator 103 perform the QCTC generation process.

If the number of interleaved code symbols is 15,360 and the data rate (or code rate) of sub-codes is given as 307.2 kbps, the QCTC generator 103 generates the first sub-code having 21,504 symbols by taking the 15,360 interleaved code symbols and repeating part of the first half of the interleaved code symbols. If the data rate is 614.4 kbps, the QCTC generator 103 generates the first sub-code by taking the first 10,752 code symbols from the first half of the interleaved code symbols. And if the data rate is 1228.8 kbps or 2457.6 kbps, the QCTC generator 103 generates the first sub-code by taking the first 5,376 code symbols from the interleaved code symbols.

To generate a QCTC (or sub-codes), the channel interleaver 102 should take particular characteristics because the five symbols X, $Y_0$, $Y_1$, $Y_0'$, and $Y_1'$ are distributed through channel interleaving and the distributed code symbols are not suitable for the input of the QCTC generator 103 and because it is not easy to generate sub-codes satisfying the characteristics of a QCTC with the mixed symbols of X, $Y_0$, $Y_1$, $Y_0'$, and $Y_1'$. In this context, the present invention provides a method of generating a QCTC in a predetermined way irrespective of the code rate of each sub-code.

Figure 2:
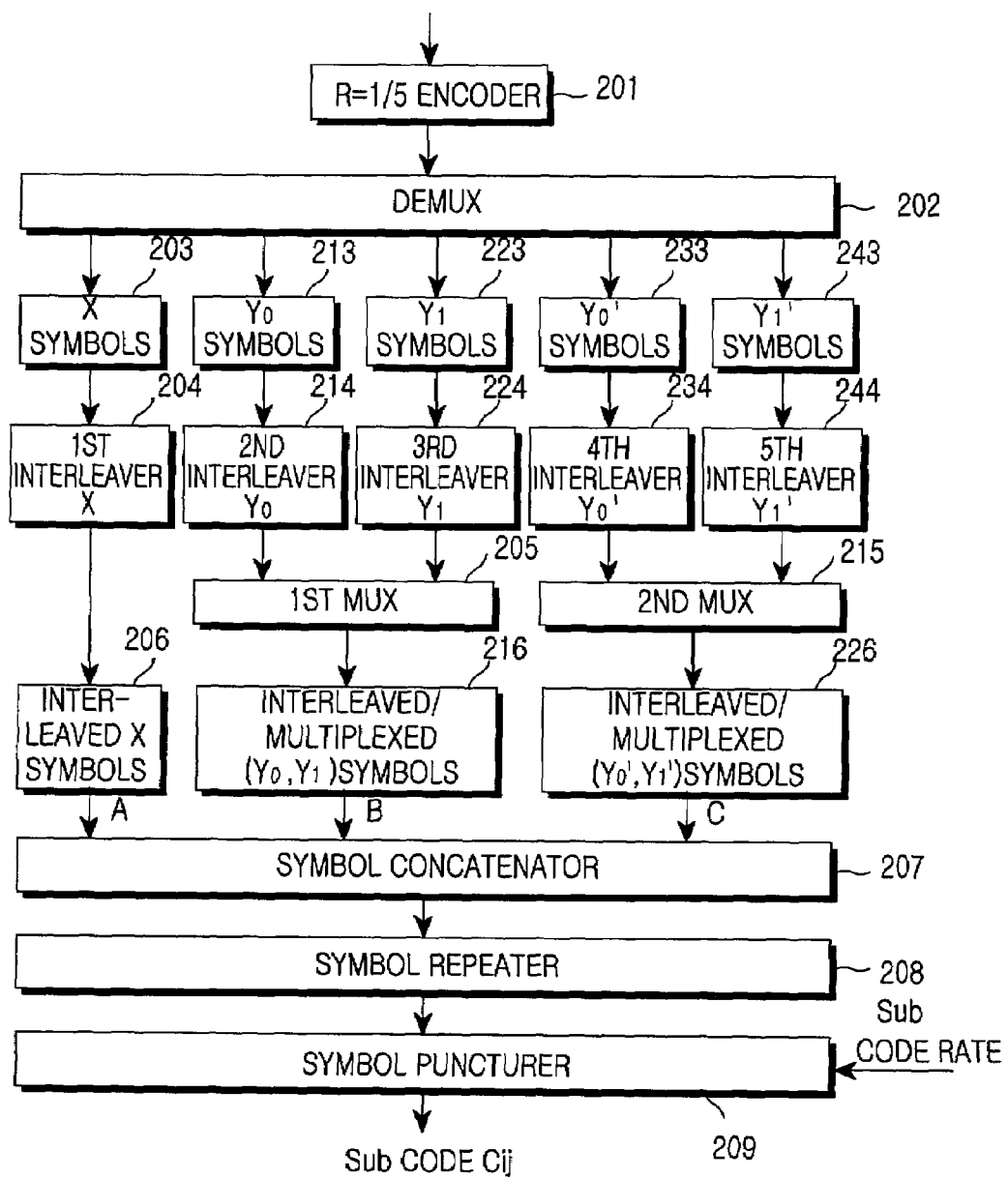
FIG. 2 is a block diagram of an embodiment of the QCTC generating apparatus according to the present invention.
Figure 2:
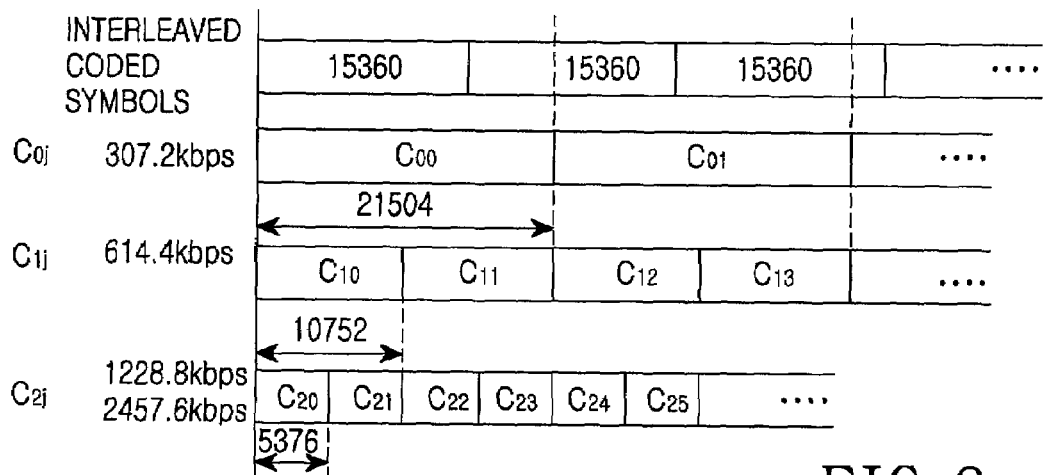

FIG. 2 is a block diagram of the QCTC generating apparatus according to an embodiment of the present invention.

Referring to FIG. 2, an encoder 201 generates code symbols by encoding input information symbols (i.e. input encoder packet). The encoder 201 uses a mother code with R=⅕ or with any other code rate. A mother code is determined by the system used. A turbo code with R=⅕ is used herein as a mother code by way of example. Then, the encoder 201 generates information symbols X, first parity symbols $Y_0$ and $Y_0'$ and second parity symbols $Y_1$ and $Y_1'$ by encoding input information symbols. The first parity symbols $Y_0$ and $Y_0'$ are output from a first constituent encoder and the second parity symbols $Y_1$ and $Y_1'$ from a second constituent encoder. The first and second constituent encoders (not shown) are contained in encoder 201. The primary parity symbols $Y_0$ and $Y_1$ from the first and second constituent encoders have a higher transmission priority than the secondary parity symbols $Y_0'$ and $Y_1'$.

A demultiplexer (DEMUX) 202 groups the code symbols received from the encoder 201 into information symbols X 203, parity symbols $Y_0$ 213, parity symbols $Y_1$ 223, parity symbols $Y_0'$ 233, and parity symbols $Y_1'$ 243 and outputs the five symbol groups to corresponding respective interleavers 204, 214, 224, 234 and 244.

Interleavers 204, 214, 224, 234 and 244 randomly permute the sequences of the input code symbols by interleaving. Various interleaving methods are available as long as the following condition is satisfied.

(Condition) Interleaved code symbols are partially punctured in such a way that the puncturing pattern of code symbols before interleaving has a uniform puncturing distance.

The reason for satisfying the above condition is that when code symbol groups X, $Y_0$, $Y_1$, $Y_0'$, and $Y_1'$ are punctured in the same number of code symbol positions, the distance between punctured code symbol positions in the code symbols before interleaving must be equal to achieve optimum turbo code performance. In other words, when puncturing is applied to turbo codes, uniformity is a significant factor that determines the performance of the turbo codes. In accordance with the present invention, sub-block interleaving applies independently to the code symbols X, $Y_0$, $Y_0'$, $Y_1$, and $Y_1'$. Uniform puncturing in each interleaver output maintains an equal distance between punctured code symbols in encoder output. Therefore, it can be concluded that channel interleaving must be chosen so that puncturing in interleaved code symbols can maintain a uniform puncturing distribution in channel encoder output.

Such channel interleaving methods include bit reversal order (BRO) interleaving and partial bit reversal order (PBRO) interleaving. The BRO interleaving is practicable only if the number of input information symbols to an encoder and the number of each code symbol set X, $Y_0$, $Y_0'$, $Y_1$, and $Y_1'$ are powers of 2, that is, $2^m$ wherein m is a parameter to make a block size of sub block interleaver such as block size $N=2^m*J$.

The PBRO interleaving was designed to satisfy the aforestated condition even if the number of information symbols and the number of each encoder output symbol set X, $Y_0$, $Y_0'$, $Y_1$, and $Y_1'$ are not powers of 2 in order to overcome the limitation of the BRO interleaving. A detailed description of this sub-block channel interleaving will be avoided here and it is to be noted that any channel interleaving method can be implemented in the present invention as long as it satisfies the above condition.

The interleaved code symbols X 206 (shown as a block for convenience) output from the first interleaver 204 are applied directly to the input of a symbol concatenator 207. The interleaved code symbols $Y_0$ and $Y_1$ from the second and third interleavers 214 and 224 are input to a first multiplexer (MUX) 205 and the interleaved code symbols $Y_0'$ and $Y_1'$ from the fourth and fifth interleavers 234 and 244, to a second MUX 215. That is, the first MUX 205 receives the primary parity symbols and the second MUX 215 receives the secondary parity symbols.

The first MUX 205 multiplexes the interleaved parity symbols $Y_0$ and $Y_1$ 216 and feeds the output to the symbol concatenator 207. The second MUX 215 multiplexes the interleaved parity symbols $Y_0'$ and $Y_1'$ 226 and feeds its output to the symbol concatenator 207. That is, the MUXes 205 and 215 multiplex the parity symbol sequences by priority level. With the aid of the MUXes 205 and 215, the interleaver outputs are rearranged and then divided into three sub-groups, 206, 216 and 226.

The above-described process, which is essential to generation of QCTCs according to the present invention, will be described in more detail. As shown in FIG. 2, information symbols X form an independent sub-group without passing through multiplexing after sub-block interleaving. Let the sub-block interleaved symbols be $Sb_{i\_}X$, which can be expressed as $$Sb_{i\_}X(1), Sb_{i\_}X(2), Sb_{i\_}X(3), Sb_{i\_}X(4) \quad (1)$$

where $Sb_{i\_}X(1)$ indicates the first code symbol output from the first interleaver 204. $Sb_{i\_}X$ is referred to as sequence A.

Then, the interleaved code symbols $Y_0$ and $Y_1$ output from the second and third interleavers 214 and 224 are grouped into one sub-group. If the code symbols $Y_0$ are $Sb_{i\_}Y_0$, $Sb_{i\_}Y_0$ can be expressed as $$Sb_{i\_}Y_0(1), Sb_{i\_}Y_0(2), Sb_{i\_}Y_0(3), Sb_{i\_}Y_0(4) \quad (2)$$

where $Sb_{i\_}Y_0(1)$ indicates the first code symbol output from the second interleaver 214. If the code symbols $Y_1$ are $Sb_{i\_}Y_1$, $Sb_{i\_y1}$ can be expressed as $$Sb_{i\_}Y_1(1), Sb_{i\_}Y_1(2), Sb_{i\_}Y_1(3), Sb_{i\_}Y_1(4) \quad (3)$$

where $Sb_{i\_}Y_1(1)$ and $Sb_{i\_}Y_1(2)$ indicate the first and second code symbols respectively, output from the third interleaver 224. After multiplexing the code symbols $Y_0$ and $Y_1$, $$Sb_{i\_}Y_0(1), Sb_{i\_}Y_1(1), Sb_{i\_}Y_0(2), Sb_{i\_}Y_1(2), Sb_{i\_}Y_0(3), Sb_{i\_}Y_1(3) \quad (4)$$

These multiplexed symbols are referred to as sequence B.

The reason for multiplexing the interleaved code symbols $Sb_{i\_}Y_0$ and $Sb_{i\_}Y_1$ is that when M successive symbols are punctured in the sequence B irrespective of the first half or second half of the sequence B, the number of punctured symbols in $Sb_{i\_}Y_0$ is equal to that of punctured symbols in $Sb_{i\_}Y_1$ only if M is an even number. If M is an odd number, the difference between the numbers of punctured symbols in $Sb_{i\_}Y_0$ and in $Sb_{i\_}Y_1$ is only 1. The multiplexing always satisfies the QCTC characteristic that the number of punctured parity symbols $Y_0$ is equal to that of punctured parity symbols $Y_1$.

In the same manner, the interleaved code symbols $Y_0'$ and $Y_1'$ output from the fourth and fifth interleavers 234 and 244 are grouped into one sub-group. If the code symbols $Y_0'$ and $Y_1'$ are $Sb_{i\_}Y_0'$ and $Sb_{i\_}Y_1'$, respectively, $Sb_{i\_}Y_0'$ and $Sb_{i\_}Y_1'$ can be expressed as $$Sb_{i\_}Y_0'(1), Sb_{i\_}Y_0'(2), Sb_{i\_}Y_0'(3), Sb_{i\_}Y_0'(4) \quad (5)$$

and $$Sb_{i\_}Y_1'(1), Sb_{i\_}Y_1'(2), Sb_{i\_}Y_1'(3), Sb_{i\_}Y_1'(4) \quad (6)$$

Then, the output of the second MUX 215 is $$Sb_{i\_}Y_0'(1), Sb_{i\_}Y_1'(1), Sb_{i\_}Y_0'(2), Sb_{i\_}Y_1'(2), Sb_{i\_}Y_0'(3), Sb_{i\_}Y_1'(3) \quad (7)$$

These multiplexed symbols are referred to as sequence C.

The reason for multiplexing the interleaved code symbols $Sb_{i\_}Y_0'$ and $Sb_{i\_}Y_1'$ is that when M successive symbols are punctured in the sequence C irrespective of the first half or second half of the sequence C, the number of punctured symbols in $Sb_{i\_}Y_0'$ is equal to that of punctured symbols in $Sb_{i\_}Y_1'$ only if M is an even number. If M is an odd number, the difference between the numbers of punctured symbols in $Sb_{i\_}Y_0'$ and in $Sb_{i\_}Y_1'$ is only 1. The multiplexing always satisfies the QCTC characteristic that the number of punctured parity symbols $Y_0'$ is equal to that of punctured parity symbols $Y_1'$.

The symbol concatenator 207 sequentially concatenates the sequences A, B and C of the first, second, and third sub-groups and generates a symbol sequence [A:B:C].

$$[A:B:C]=[Sb_{i\_}X(1), Sb_{i\_}X(2), Sb_{i\_}X(3), \ldots] \\ [Sb_{i\_}Y_0(1), Sb_{i\_}Y_1(1), Sb_{i\_}Y_0(2), \\ Sb_{i\_}Y_1(2), \ldots][Sb_{i\_}Y_0'(1), Sb_{i\_}Y_1'(1), \\ Sb_{i\_}Y_0'(2), Sb_{i\_}Y_1'(2), \ldots] \quad (8)$$

As seen from the above formula, information symbols are placed first, followed by alternating parity symbols $Y_0$ and $Y_1$ and then by alternating parity symbols $Y_0'$ and $Y_1'$ in the sequence [A:B:C]. This symbol arrangement assumes a very significant meaning in QCTC generation, which will be described below.

Puncturing should be carried out to generate a sub-code with a code rate from the turbo code of (8). The puncturing is defined by a "QCTC". The QCTC should have the following characteristics.

(1) Information symbols precede all other code symbols in transmission. Especially, as the code rate of sub-codes is close to 1, this characteristic becomes more important.

(2) A puncturing pattern is formed so that the number of parity symbols output from each constituent encoder (a first constituent encoder and a second constituent encoder) is equal or their difference in number is minimum.

(3) The number of punctured symbols in the parity symbols $Y_0$ and $Y_0'$ is determined such that the code rate of the first constituent encoder is always less than 1. That is, the performance of turbo codes is ensured when at least one parity symbol $Y_0$ or $Y_0'$ exists.

(4) The distance between punctured symbols in a QCTC resulting from puncturing is equal.

(5) A turbo code produced by combining sub-codes of QCTCs assumes the characteristics of a quasi-complementary code.

A QCTC with a sub-code code rate, which is generated by puncturing or pruning as many symbols as necessary from the end of the symbol sequence [A:B:C], satisfies the above five characteristics. In other words, an intended sub-code of a QCTC is generated by repeating and puncturing as many symbols as needed in the symbol sequence [A:B:C] in a symbol sequence repeater 208 and a symbol puncturer 209. The symbol sequence repeater 208 repeats the symbol sequence received from the symbol concatenator in a predetermined way. The repetition method is determined according to the code rate of the sub-code. The symbol puncturer 209 punctures or prunes as many symbols as a predetermined number, starting with the last symbol in the symbol sequence received from the symbol sequence repeater 208, to thereby create the sub-code of the QCTC. The number of punctured symbols depends on the code rate of the sub-code. Therefore, the code rate of the sub-code should be provided to the symbol sequence repeater 208 and the symbol puncturer 209 in order to perform sequence repetition and symbol puncturing. Alternatively, a higher layer controller (not shown) can calculate the number of repeated symbols and the number of punctured symbols according to a mother code rate and a sub-code rate and feed the information to the symbol sequence repeater 208 and the symbol puncturer 209.

In other words, the symbol puncturer 209 selects a predetermined number of symbols counted from a given symbol position in the symbol sequence received from the symbol sequence repeater 208, thereby generating the sub-code of the QCTC. The given symbol position refers to the symbol next to the last symbol selected for the previous transmission. Therefore, the symbol puncturer 209 can be called a "symbol selector".

The interleavers 203, 213, 223, 233 and 243, the MUXes 205 and 215, and the symbol concatenator 207 in FIG. 2 correspond to the channel interleaver 102 in FIG. 1, and the symbol sequence repeater 208 and the symbol puncturer 209 both correspond to the QCTC generator 103.

Returning to FIG. 1, assuming a mother code rate R=⅕ and 3,072 input information bits, the channel encoder 101 outputs 15,360 code symbols. Hereinbelow, there will be a description of generating QCTCs with different code rates (or data rates), for example, a first QCTC $C_{0j}$ at 307.2 kbps, a second QCTC $C_{1j}$ at 614.4 kbps, and a third QCTC $C_{3j}$ at 1288.8 kbps, from the code symbols.

As described before, the 15,360 code symbols are classified into five sub-groups, interleaved, and then rearranged as the symbol sequence of Eq. (8). Then, the 15,360 code symbols are subject to repetition according to a predetermined rule and puncturing (or pruning) according to a predetermined sub-code code rate. Thus, an intended sub-code is generated.

For a data rate of 307.2 kbps, if the sub-codes of the first QCTC $C_{0j}$ are 21,504 bits in length, the first sub-code $C_{00}$ is generated by selecting the first 21,504 symbols from the interleaved and repeated symbol sequence. The second sub-code $C_{01}$ is generated by selecting 21,504 symbols starting with the symbol following the first sub-code $C_{00}$ from the repeated symbol sequence. The third sub-code $C_{02}$ is generated by selecting the following 21,504 symbols.

Similarly, for a data rate of 614.4 kbps, if the sub-codes of the second QCTC $C_{1j}$ are 10,752 bits in length, the first sub-code $C_{10}$ is generated by selecting the first 10,752 symbols from the repeated symbol sequence. In other words, the first sub-code $C_{10}$ is generated by pruning all subsequent symbols following the first 10,752 symbols in the repeated symbol sequence. The pruning is performed in the symbol puncturer 209 as stated before. The second sub-code $C_{11}$ is generated by selecting 10,752 symbols starting with the symbol following the first sub-code $C_{10}$ from the repeated symbol sequence. The third sub-code $C_{12}$ is generated by selecting the 10,752 symbols following the second sub-code $C_{11}$.

Similarly, for a data rate of 1228.8 kbps, if the sub-codes of the third QCTC $C_{2j}$ are 5,376 bits in length, the first sub-code $C_{20}$ is generated by selecting the first 5,376 symbols from the repeated symbol sequence. The second sub-code $C_{21}$ is generated by selecting 5,376 symbols starting with the symbol following the first sub-code $C_{20}$ from the repeated symbol sequence. The third sub-code $C_{22}$ is generated by selecting the following 5,376 symbols. In this manner, the sub-codes of the QCTC at 1228.8 kbps are generated.

The system stores information about the position of the last symbol in the previous transmitted sub-code for each QCTC. When a data rate (or code rate) for retransmission is determined, the system selects a QCTC corresponding to the data rate and generates a sub-code by selecting a predetermined number of symbols following the stored last symbol for the selected QCTC according to the data rate. If the selected symbols exceed one interleaved symbol block, the remaining symbols are selected from the following block. In this case, sub-codes are generated by repeating a block of interleaved symbols. To do so, a storing area is needed to store the repeated blocks.

Alternatively, the interleaved symbols can be stored in a circular buffer memory and a sub-code is generated by selecting symbols recursively. That is, if interleaved symbols are all selected, a predetermined number of symbols are selected from the interleaved symbols starting with the first symbol. Then, the symbol sequence repeater 208 can be omitted since the circular buffer memory functions as the symbol sequence repeater 208.

The above embodiment of the present invention describes two-dimensional QCTCs. In the two-dimensional QCTC scheme, a QCTC corresponding to each code rate is generated independently and the sub-codes of the QCTC are sequentially transmitted. However, the two-dimensional QCTCs are not optimum for the reasons described below.

As shown in FIG. 2, it is assumed that the first sub-code $C_{00}$ of the first QCTC $C_{0j}$ is used for initial transmission, the first sub-code $C_{10}$ of the second QCTC $C_{1j}$ is used for the next transmission, and the first sub-code $C_{20}$ of the third QCTC $C_{2j}$ is used for the third transmission. Then, a receiver decodes data by combining the three sub-codes ($C_{00}$, $C_{10}$, $C_{20}$). In this case, however, the code combining does not recover an original code with a code rate of ⅕, only to increase the symbol energy of information symbols and thus not to optimize decoding performance. This implies that there is a problem with the transmission order of the sub-codes, that is, selection of the sub-codes. To overcome the problem, adaptive QCTCs are proposed. In the adaptive QCTC scheme, the number of code symbols to be selected is determined according to the code rate of a sub-code, and the sub-code is generated by selecting the determined number of symbols starting with the symbol following the last symbol used for the previous transmission.

Figure 3:
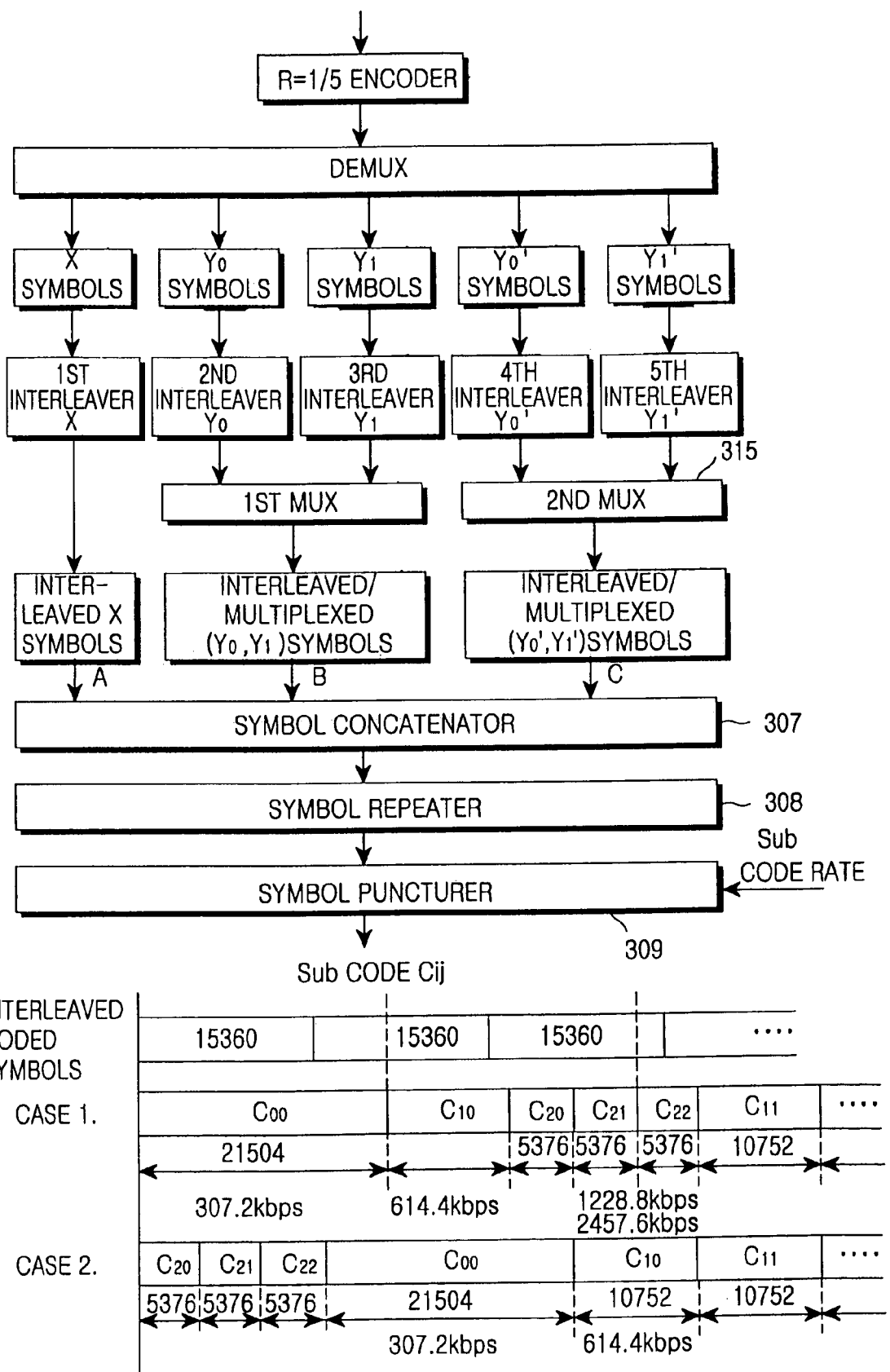
FIG. 3 is a block diagram of another embodiment of the QCTC generating apparatus according to the present invention.

FIG. 3 is a block diagram of another embodiment of the QCTC generating apparatus. The structure shown in FIG. 3 is the same as that shown in FIG. 2 except that the symbol sequence repeater and the symbol puncturer operate in different manners. Therefore, the following description is made mainly of the symbol sequence repeater 308 and the symbol puncturer 309.

The symbol sequence repeater 308 repeats a symbol sequence received from a symbol concatenator 307 in a predetermined way. The repetition may be carried out according to a given parameter in the symbol sequence repeater 308, or under the control of a higher layer controller (not shown), or upon request of the symbol concatenator 307. The above process is implemented in the same manner as described referring to FIG. 2. Then, the symbol puncturer 309 punctures symbols received from the symbol sequence repeater 308 according to a different rule from the rule applied in FIG. 2 to generate a sub-code. The puncturing rule is as follows.

It is assumed that transmission starts at time k, a sub-code transmitted at time (k+h) is expressed as $C_{ij}(k+h)$, and the code symbols of a mother code with $R=\frac{1}{5}$ are $C_m(0)$, $C_m(1)$, ..., $C_m(N-1)$. The number of the code symbols, N, is defined as L_INF×5 since the mother code rate is ⅕. Here, L_INF denotes the size of a sub-block interleaver, or the number of information symbols.

Step 1: the length of an initial sub-code is determined.

For an initial transmission, one $C_{i0}$ of the first sub-codes $C_{00}$, $C_{10}$, $C_{20}$ of available QCTCs is selected according to a given code rate and the length of the selected sub-code $C_{i0}$ is stored as a variable L_SC. The code rate or length L_SC of the sub-code is predetermined in the system according to channel environment including transmission channel condition and input data rate. The description is made in the context of three QCTCs shown in FIG. 3 for better understanding of the present invention, but the number of sub-codes is not limited.

Step 2: a sub-code for initial transmission is selected and transmitted.

After the length of a sub-code to be transmitted is determined, $C_m(0), C_m(1), \ldots, C_m(L\_SC-1)$ are selected among the code symbols of the mother code. If L_SC exceeds N, $C_m(0), C_m(1), \ldots, C_m(N-1)$ are transmitted P times and then $C_m(0), C_m(1), \ldots, C_m(q-1)$ are transmitted. Here, P and q are the quotient and remainder of L_SC/N, respectively and P and q are calculated by L_SC mod N. Then, the variable q is stored for the next transmission for use in detecting the position of the last symbol of the previous transmitted sub-code with respect to the block of interleaved symbols.

Step 3: the starting position of a sub-code for the next transmission and the length of the sub-code are determined.

For the next transmission, the code rate R_SC of a new sub-code to be transmitted is determined according to channel environment and the length L_SC of the sub-code is determined according to the determined code rate. The length L_SC and the code rate R_SC is in the relation of $$L\_SC = L\_INF \times (1/R\_SC) \quad (9)$$

A higher layer system transmits the sub-code length L_SC and the sub-code code rate R_SC to the symbol puncturer 309 for each transmission.

Step 4: a sub-code for the next transmission is selected and transmitted.

After the length L_SC of the sub-code to be transmitted is determined, $C_m(q), C_m(q+1), \ldots, C_m(q+L\_SC-1)$ are selected among the code symbols of the mother code. In other words, as many symbols as the sub-code length are selected from the mother code symbols starting with the symbol following the last symbol selected for the previous transmission. If q+L_SC exceeds N, a row comprised of N code symbols starting with $C_m(q)$ are selected recursively and transmitted P times and then the remaining q' code symbols are sequentially transmitted. Here, P and q' are the quotient and remainder of (L_SC)/N, respectively and the q' is calculated by (q+L_SC) mod N. Then, the next symbol position value of the position of the last selected symbol for the next transmission is stored to the q. The variable q is the next symbol position of the last symbol position among symbols comprised of the last transmitted sub-code. After the generated sub-code is transmitted, the procedure returns to step 3.

The transmission of adaptive QCTCs will be made clear with cases shown in FIG. 3. Referring to FIG. 3, a low rate sub-code with a code rate of ⅐ is initially transmitted in Case 1, and a high rate sub-code with a code rate of 4/7 is initially transmitted in Case 2. As seen from the cases, N (=15,360) successive mother code symbols are repeated and as many code symbols as a size corresponding to the length of a sub-code to be transmitted (or the code rate of the sub-code) are selected sequentially from the repeated mother code symbols, at each transmission.

In real implementation, a buffer is not used to store (P−1) times repeated-mother codes, but a single circular buffer is employed to store N code symbols and recursively select code symbols to thereby generate a sub-code of an intended length. That is, use of the circular buffer memory obviates the need of sequence repetition. Any reception buffer is available to a receiver as long as it can store N soft metrics for code combining.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A QCTC (Quasi-Complementary Turbo Code) generating apparatus comprising:
    a turbo encoder having a plurality of constituent encoders, for receiving information bits, generating a plurality of parity symbol sequences by encoding the information bits, and outputting an information symbol sequence and the plurality of parity symbol sequences, each constituent encoder for generating at least one parity symbol sequence corresponding to at least one parity symbol sequence from another constituent encoder;
    an interleaver for individually interleaving the information symbol sequence and the parity symbol sequences;
    a multiplexer for generating a new parity symbol sequence by multiplexing the interleaved symbols of the corresponding parity symbol sequences;
    a symbol concatenator for serially concatenating the interleaved information symbol sequence and the new parity symbol sequence; and
    a QCTC generator for generating a sub-code of a QCTC with a given code rate by selecting a predetermined number of symbols from the serially concatenated symbol sequence,
    wherein the predetermined number of symbols is started from a starting symbol at a given starting position and the number of the selected symbols is determined according to the code rate.

2. The QCTC generating apparatus of claim 1, wherein the interleaver individually interleaves the information symbol sequence and the plurality of parity symbol sequences by PBRO (Partial Bit Reversal Order) interleaving.

3. The QCTC generating apparatus of claim 1, wherein the given starting position is the position of a symbol following the last symbol selected for the previous transmission.

4. The QCTC generating apparatus of claim 1, wherein the QCTC generator comprises:
  a symbol repeater for repeating the serially concatenated symbol sequence; and
  a symbol selector for generating the sub-code by selecting the predetermined number of symbols from the repeated symbol sequence according to the given code rate.

5. The QCTC generating apparatus of claim 1, wherein the QCTC generator comprises:
  a circular buffer memory for storing the serially concatenated symbol sequence; and
  a symbol selector for generating the sub-code by selecting the predetermined number of symbols from the stored symbol sequence at the given starting position according to the given code rate.

6. A QCTC (Quasi-Complementary Turbo Code) generating method comprising the steps of:
  receiving information bits;
  generating a plurality of parity symbol sequences by encoding the information bits, the plurality of parity symbol sequences being generated from constituent encoders, at least one parity symbol sequence being generated from each of the constituent encoders, and the at least one parity symbol sequence from one constituent encoder corresponding to the at least one parity symbol sequence from another constituent encoder;
  outputting an information symbol sequence and the plurality of parity symbol sequences;
  individually interleaving the information symbol sequence and the parity symbol sequences;
  generating a new parity symbol sequence by multiplexing the interleaved symbols of the corresponding parity symbol sequences;
  serially concatenating the interleaved information symbol sequence and the new parity symbol sequence; and
  generating a sub-code of a QCTC with a given code rate by selecting a predetermined number of symbols from the serially concatenated symbol sequence,
  wherein the predetermined number of symbols is started from a starting symbol at a given starting position and the number of the selected symbols is determined according to the code rate.

7. The QCTC generating method of claim 6, wherein the interleaving step is performed by PBRO (Partial Bit Reversal Order) interleaving.

8. The QCTC generating method of claim 6, wherein the given starting position is the position of a symbol following the last symbol selected for the previous transmission.

9. The QCTC generating method of claim 6, wherein the QCTC generation step comprises the steps of:
  repeating the serially concatenated symbol sequence; and
  generating the sub-code by selecting the predetermined number of symbols from the repeated symbol sequence according to the given code rate.

10. The QCTC generating method of claim 6, wherein the QCTC generation step comprises the steps of:
  storing the serially concatenated symbol sequence in a circular buffer memory; and
  generating the sub-code by selecting the predetermined number of symbols from the circular buffer memory at the given starting position according to the given code rate.

* * * * *